(12) United States Patent
Ma et al.

(10) Patent No.: US 10,990,014 B2
(45) Date of Patent: Apr. 27, 2021

(54) PERFORMANCE IMPROVEMENT OF EUV PHOTORESIST BY ION IMPLANTATION

(71) Applicant: Varian Semiconductor Equipment Associates, Inc., Gloucester, MA (US)

(72) Inventors: Tristan Y. Ma, Lexington, MA (US); Huixiong Dai, San Jose, CA (US); Anthony Renau, West Newbury, MA (US); John Hautala, Beverly, MA (US); Joseph Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 25 days.

(21) Appl. No.: 16/691,739

(22) Filed: Nov. 22, 2019

(65) Prior Publication Data

US 2020/0096870 A1 Mar. 26, 2020

Related U.S. Application Data

(62) Division of application No. 15/786,806, filed on Oct. 18, 2017, now Pat. No. 10,545,408.

(60) Provisional application No. 62/547,418, filed on Aug. 18, 2017.

(51) Int. Cl.
| | | |
|---|---|---|
| *G03F 7/38* | (2006.01) | |
| *G03F 7/20* | (2006.01) | |
| *G03F 7/16* | (2006.01) | |
| *G03F 7/004* | (2006.01) | |
| *G03F 7/09* | (2006.01) | |

(52) U.S. Cl.
CPC .............. *G03F 7/38* (2013.01); *G03F 7/0042* (2013.01); *G03F 7/094* (2013.01); *G03F 7/168* (2013.01); *G03F 7/203* (2013.01); *G03F 7/2004* (2013.01)

(58) Field of Classification Search
CPC ....................................................... G03F 7/38
See application file for complete search history.

(56) References Cited

U.S. PATENT DOCUMENTS

| | | | |
|---|---|---|---|
| 5,858,623 A | 1/1999 | Yu | |
| 2009/0214169 A1 | 8/2009 | Linares | |
| 2010/0015771 A1* | 1/2010 | Hsieh .................. | H01L 29/7833 438/275 |
| 2010/0181503 A1 | 7/2010 | Yanagida et al. | |
| 2011/0300711 A1 | 12/2011 | Martin et al. | |
| 2012/0171804 A1 | 7/2012 | Moslehi et al. | |
| 2015/0008430 A1 | 1/2015 | Yamazaki | |
| 2016/0064239 A1 | 3/2016 | Shih et al. | |
| 2017/0168398 A1 | 6/2017 | Zi | |
| 2017/0227851 A1 | 8/2017 | Lai et al. | |
| 2017/0365693 A1 | 12/2017 | Yamazaki | |

* cited by examiner

*Primary Examiner* — Kathleen Duda
(74) *Attorney, Agent, or Firm* — Kacvinsky Daisak Bluni PLLC

(57) ABSTRACT

A method of patterning a substrate may include providing a blanket photoresist layer on the substrate; performing an ion implantation procedure of an implant species into the blanket photoresist layer, the implant species comprising an enhanced absorption efficiency at a wavelength in the extreme ultraviolet (EUV) range; and subsequent to the performing the ion implantation procedure, performing a patterned exposure to expose the blanket photoresist layer to EUV radiation.

11 Claims, 5 Drawing Sheets

PERFORMANCE IMPROVEMENT OF EUV PHOTORESIST BY ION IMPLANTATION

RELATED APPLICATIONS

This application is a divisional of, and claims the benefit of priority to, U.S. patent application Ser. No. 15/786,806, filed Oct. 18, 2017, entitled "Performance Improvement Of EUV Photoresist By Ion Implantation," which is a non-provisional of U.S. Provisional Patent Application 62/547,418, filed Aug. 18, 2017 entitled "Performance Improvement Of EUV Photoresist By Ion Implantation," the entirety of which applications are incorporated herein by reference.

FIELD OF THE DISCLOSURE

The disclosure relates generally to techniques for manufacturing devices, and more particularly, to techniques for improving photoresist for patterning substrates.

BACKGROUND OF THE DISCLOSURE

Known photoresist materials, including chemically amplified photoresists (CAR) face many challenges for application in Extreme Ultraviolet (EUV) lithography. To achieve higher resolution and/or lower line-edge and line-width roughness (LER/LWR), the CAR materials demands entail a high EUV dose, which high dose may be uneconomical given the high cost of EUV power. For example, up to 96% of EUV power is lost in optics of an EUV system before EUV radiation reaches a substrate to be exposed. In the last few years, alternative photoresist systems such as metal-oxide photoresist and metal-containing photoresist have been explored. Advantages provided by such alternative photoresist systems include increased absorption of incident EUV photons as well as better etch selectivity, allowing thinner photoresist layers to be used for patterning of a substrate.

There are also several limitations for the use of known metal-oxide or metal-based photoresist architecture. One limitation is the finite lifetime of photoresist materials that incorporate metal-oxide nanoparticles into a photoresist matrix. In order to provide acceptable shelf life these photoresist materials may employ a stabilizer to stabilize a nanoparticle suspension, adding to cost and reducing sensitivity of the photoresist material.

Moreover, dispensing and maintaining an acceptable degree of uniformity of nanoparticle suspension within a photoresist at the nanometer length scale may be particularly challenging. Many of the sensitizers that may be used in a photoresist formulation also readily sublime during a soft bake operation, resulting in additional non-uniformity. This inhomogeneity may lead to difficulty in controlling LWR, as well as difficulty in controlling critical dimension (CD).

Because metal-based photoresists are highly etch-resistant, metal-based photoresists may be applied as thinner layers for patterning a substrate than conventional CAR materials, as thin as ~15 nm, for example. The thinner film imparts the advantage of being less susceptible to pattern collapsing, but also entails a smaller photoresist volume and thus less photons being absorbed. Accordingly, more noise and worse LER/LWR may result from such thin photoresists. Increasing the film thickness, runs the risk of generating a patterned photoresist feature having a "T-topping" structure, where the photoresist feature may exhibit a "T" shape in cross-section after patterning and development. That is, the photon availability attenuates as a function of thickness of the photoresist, due to strong absorption by the metal sensitizers. Because of greater photon density at the top of a photoresist feature, and since most existing metal-based photoresists are negative tones, this photon attenuation results in a photoresist profile resembling a "T" or a reversed pyramid. While negative tone photoresists in general are better for improving small pitch resolution this advantage is offset by the T-topping problem.

Another issue with the employment of photoresist containing metal oxide particles or metal particles is that metal hydrides may form in a scanner of a EUV lithographic tool due to reaction between the photoresist and hydrogen used in the scanner. The metal hydrides may deposit on the EUV mirror surfaces, reducing optics lifetime.

With respect to these and other considerations, the present embodiments are provided.

BRIEF SUMMARY

In one embodiment, a method of patterning a substrate may include providing a blanket photoresist layer on the substrate; performing an ion implantation procedure of an implant species into the blanket photoresist layer, the implant species comprising an enhanced absorption efficiency at a wavelength in the extreme ultraviolet (EUV) range. The method may further include, subsequent to the performing the ion implantation procedure, performing a patterned exposure to expose the blanket photoresist layer to EUV radiation.

In another embodiment, a method of enhancing a photoresist layer may include: applying the photoresist layer as a blanket photoresist layer on a substrate; and prior to patterning the blanket photoresist layer, performing an ion implantation procedure of an implant species into the blanket photoresist layer, the implant species comprising an enhanced absorption efficiency at a wavelength in the extreme ultraviolet (EUV) range, the enhanced absorption efficiency being greater than $2 \times 10^6$ cm$^2$/mol.

In an additional embodiment, a method of improved patterning of a photoresist layer, may include providing an underlayer on a substrate. The method may include performing an ion implantation procedure of an implant species into the underlayer, the implant species comprising an enhanced absorption efficiency at a wavelength in the extreme ultraviolet (EUV) range, the enhanced absorption efficiency being greater than $2 \times 10^6$ cm$^2$/mol. The method may also include applying the photoresist layer as a blanket photoresist layer on the underlay; and patterning the blanket photoresist layer by exposure to EUV radiation.

Figure 1:
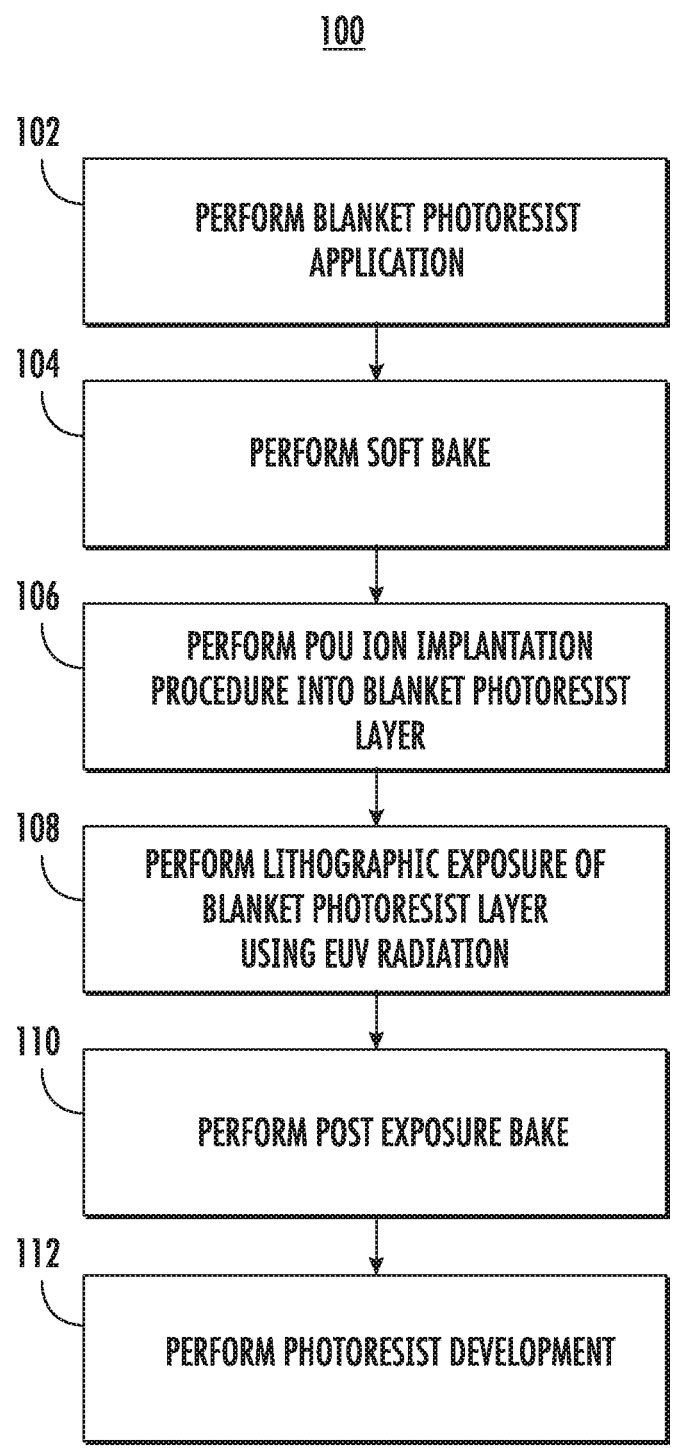
FIG. 1 shows an exemplary process flow according to embodiments of the disclosure.

The drawings are not necessarily to scale. The drawings are merely representations, not intended to portray specific parameters of the disclosure. The drawings are intended to depict typical embodiments of the disclosure, and therefore are not to be considered as limiting in scope. In the drawings, like numbering represents like elements.

DETAILED DESCRIPTION

A material and method in accordance with the present disclosure will now be described more fully hereinafter with reference to the accompanying drawings, where embodiments are shown. The method and materials may be embodied in many different forms and are not to be construed as being limited to the embodiments set forth herein. Instead, these embodiments are provided so this disclosure will be thorough and complete, and will fully convey the scope of the system and method to those skilled in the art.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

In various embodiments, methods and material are provided for enhancing lithography, such as for enhancing extreme ultraviolet lithography. In some embodiments, an improved photoresist is provided by performing an ion implantation procedure to enhance EUV sensitivity of the photoresist before patterning in an EUV scanner is performed.

In particular, the ion implantation procedure may introduce an implant species that enhances EUV sensitivity of the photoresist at the point-of-use (POU) of the photoresist, such as when the photoresist is provided as a blanket photoresist layer on a substrate to be exposed.

FIG. 1 depicts a process flow 100 according to embodiments of the present disclosure. At block 102, a blanket photoresist application is performed to form a blanket photoresist layer on a substrate. The blanket photoresist may be an EUV photoresist having a known composition. While not limited to a particular thickness, in some embodiments the blanket EUV photoresist layer may have a thickness between 10 nm and 100 nm, between 15 nm and 100 nm, and in particular embodiments less than 50 nm or less than 30 nm. Thinner EUV photoresist layers may be especially appropriate to print features within the EUV photoresist layer having critical dimensions of less than 50 nm, less than 25 nm, and in some examples, less than 15 nm. Notably, the blanket EUV photoresist layer may have a uniform composition and may not include additives such as metal oxide particles or metal particles, where the problems resulting from the use of such particle additives have been detailed above.

At block 104, a soft bake of the blanket photoresist layer is performed. The soft bake may be performed according to known techniques for processing photoresist layers, in particular, EUV photoresist layers, before EUV exposure.

At block 106, a point-of-use ion implantation procedure is performed, meaning the implantation procedure is performed shortly before the substrate is exposed to an EUV exposure to pattern the blanket EUV photoresist layer. An implant species that enhances EUV sensitivity is implanted into the blanket EUV photoresist layer in the point-of-use ion implantation procedure. As detailed below, the implant species may be one of a number of different species, where the ion energy (implant energy) and ion dose is tailored according to the layer thickness or tailored to other features of the blanket EUV photoresist layer, in order to enhance the EUV lithographic exposure process to follow. In particular, the implant species may exhibit a high absorption efficiency at a wavelength in the extreme ultraviolet (EUV) range, such as at or near 13.5 nm.

At block 108, lithographic exposure of the blanket photoresist layer including the implant species is performed using EUV radiation. The exposure may perform patterning according to known EUV lithographic techniques. By virtue of the enhanced EUV sensitivity provided by the implant species, the duration of the EUV exposure to achieve a target lithographic result may be reduced in comparison to the use of conventional EUV photoresist materials.

At block 110 a post exposure bake may be performed according to known processes, while at block 112 photoresist development may be performed to produce the desired features, such as nanometer-scale photoresist features.

In particular embodiments, the implant species used in the point-of-use implantation operation described above may exhibit multiple useful properties. For one, the implant species may enhance the absorption of EUV radiation in the blanket photoresist material. For another, the implant species may constitute a material that is suitable for use in an ion source, plasma, or other source of implanting ions. For another, the implant species may be relatively safe or non-toxic.

Figure 2:
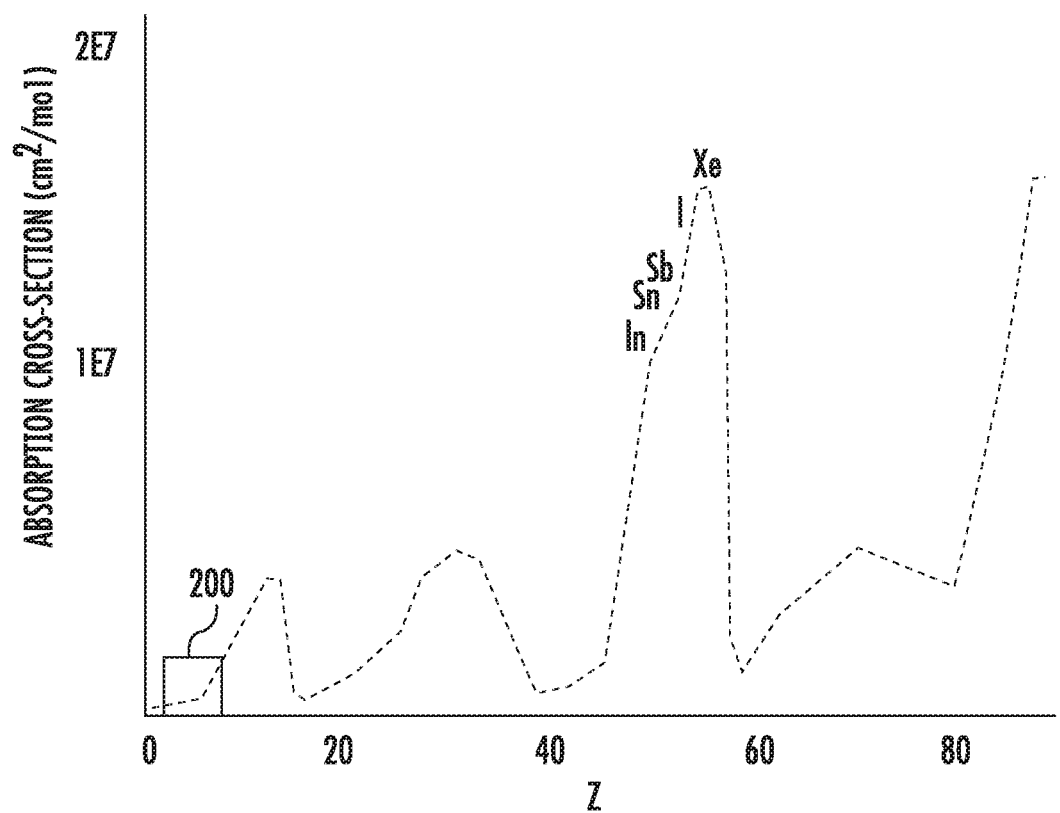
FIG. 2 shows a graph depicting general trends in EUV absorption as a function of atomic number.

In particular embodiments, tin (Sn) may be employed as an implant species for enhancing EUV absorption. An advantage provided by Sn is the very large absorption cross-section for EUV radiation as compared to the main constituent elements of known EUV photoresist materials. Turning now to FIG. 2, there is shown a graph depicting general trends in EUV absorption as a function of atomic number (Z). As illustrated, the region 200 includes elements that are the main constituents of EUV photoresist, including carbon, oxygen, nitrogen, and hydrogen. In this region of the periodic table, the EUV absorption is less than approximately $2 \times 10^6$ cm$^2$/mol. In contrast, as shown in FIG. 2, the absorption of Sn is approximately $1.4 \times 10^7$ cm$^2$/mol. This large enhancement in EUV absorption shown by implant species Sn accordingly may impart a much larger EUV sensitivity to a blanket EUV photoresist layer after implantation with the appropriate dose in the range of 5e14 to 1e17 ions/cm$^2$, depending on a number of factors such as the resist formula, resist density, initial resist thickness, targeted sensitivity improvement, tendency to form T-topping, and so forth.

In various embodiments, the ion energy for implanting Sn may range from a few hundred eV to a few kV, where the exact energy may be tailored to the thickness of the blanket EUV photoresist layer being implanted. As noted previously, in some examples this thickness of the blanket EUV photoresist layer may be in the range of 10 nm to 50 nm. By choosing the appropriate ion energy and ion dose for implanting Sn ions, a large enhancement in EUV sensitivity may be imparted into an EUV photoresist layer, while not unduly damaging the materials of the EUV photoresist layer.

Table 1, shown below, lists the energy, projected range, and sputtering yield, generated by TRIM simulations using Sn as an example implanting species, and using a surrogate substrate that contains Sn, C, O, and H. Under these conditions, the sputtering yields are sufficiently low that reduction in layer thickness of an EUV photoresist layer due to resputtering by implanting Sn ions is not a major consideration. The total ion penetration depth (implant depth), roughly twice of the Rp or projected range, is approximately 20 nm, comparable to the thickness of present-day metal oxide photoresists, such as photoresists containing tin oxide, hafnium oxide, or other oxide material. In various embodiments, this blanket photoresist to be implanted may be made of a plain conventional CAR, or a metal oxide photoresist without the metal components, or a regular metal oxide photoresist. In this manner, the photoresist after implantation may exhibit improved photosensitivity with respect to conventional photoresists, or may show further improved photosensitivity with respect to metal oxide photoresists, and may also show decreased or eliminated T-topping through non-uniform sensitizer profile.

TABLE I

| Energy of Sn (keV) | Projected Range (nm) | Total Sputtering Yield |
|---|---|---|
| 0.5 | 8.5 | 0.120 |
| 1.0 | 10.7 | 0.311 |

Figure 3:
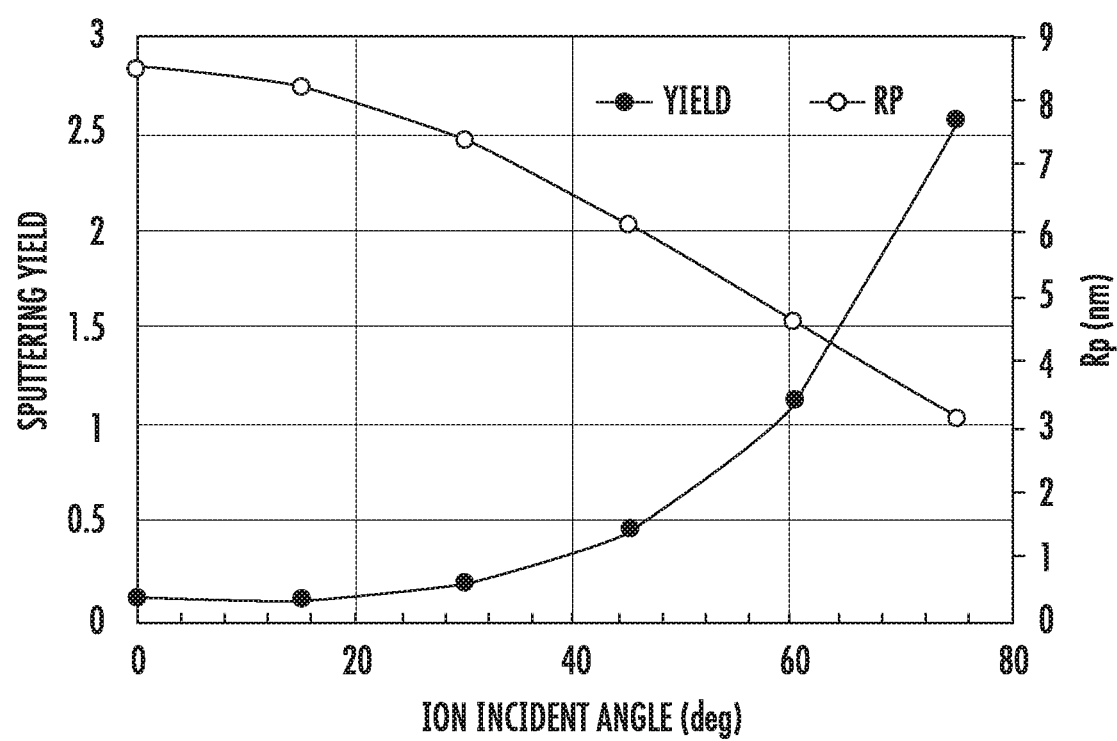
FIG. 3 presents a graph depicting simulation results of sputtering yield and Rp for 0.5 keV Sn implantation as a function of different ion incident angles.

FIG. 3 presents a graph depicting simulation results of sputtering yield and Rp for 0.5 keV Sn implantation as a function of different ion incident angles, with respect to normal incidence. The sputtering yield and Rp do not change significantly in this example at incident angles below 30°. This insensitivity toward ion incident angle at low angles has several implications. For one, the insensitivity in properties at low incidence angle means that Sn implantation may be readily performed in a variety of different apparatus. For example, beamline implanters may be used for Sn implantation, where incidence angle may readily be adjusted, including normal incidence. For another, plasma immersion systems may be used where incidence angle of ions extracted from a plasma may be approximately normal to a substrate being implanted. In systems that employ plasma chambers having extraction apertures to direct an ion beam to a substrate in an adjacent chamber, at least some ions may emerge from the plasma chamber having trajectories that form a low incidence angle with respect to normal, such as below 30 degrees. Accordingly, these "extraction aperture" systems may additionally be appropriate for Sn implantation.

An additional implication of the results of FIG. 3 is that the incidence angle may be tuned at intermediate angles to adjust the implantation range. For example, at 45 degrees incidence, the value of Rp is reduced by approximately 30% with respect to normal incidence to a value of 6 nm. This reduction of Rp may be useful to accommodate Sn within thinner photoresist layers, while not penetrating into an underlying substrate, bearing in mind the total implantation range may be approximately twice Rp. For example, according to FIG. 3, at 500 eV the total range in EUV photoresist of implanting Sn at normal incidence may be estimated to be 16 nm, while at 45 degrees the total range may be estimated to be 12 nm. Accordingly, a 12 nm thick EUV photoresist layer may be implanted with 500 eV Sn ions at 45 degrees while not penetrating to an underlying substrate, while a 12 nm thick EUV photoresist layer implanted at normal incidence may fail to stop a certain fraction of ions from penetrating into the underlying substrate. While Rp may also be reduced by reducing ion energy, in some cases practical considerations such as the amount of ion current extractable from an ion source or plasma source for low energies, or the ability to properly direct a low energy ion beam to a substrate, may preclude use of lower energies.

Notably, while the sputter yield at 45 degrees may be larger than at zero degrees (normal incidence), the sputter yield may still be acceptably low so as to employ such an angle for Sn implantation.

In various additional embodiments, an implant species may be a gaseous species at room temperatures. In one embodiment, Xe may be employed as an implant species for implanting into a blanket EUV photoresist layer. Other suitable implant species include In, Sb, and I. The embodiments are not limited in this context. Any element(s) showing enhanced absorption efficiency at a wavelength in the EUV range (approximately 13.5 nm) may be suitable for implant species, where "enhanced absorption efficiency" may indicate an EUV absorption cross-section that is greater than the EUV absorption cross-sections for H, C, N, or O, meaning greater than $1.5 \times 10^6$ cm$^2$/mol. Examples of other suitable elements include I, Te, In, and Sb. Notably, at least some elements having atomic numbers in the range of 25-25 and 65-75 may also be suitable for use as EUV enhancers. The embodiments are not limited in this context.

Returning now to FIG. 2, the graph also indicates Xe, showing a high absorption cross section of approximately $1.6 \times 10^7$ cm$^2$/mol. As a noble gas element, Xe may readily be employed in a beamline ion implanter, plasma immersion apparatus, or compact plasma source apparatus having an extraction aperture, among other tools. Because Xe is a noble gas, Xe cannot be readily incorporated in photoresist layers by methods such as particle dispersion, blending, or other liquid or solid-state methods. In the present embodiments, Xe may be readily dispersed into photoresist by implantation as monatomic ions. In this manner, the element providing enhanced EUV absorption (Xe) may be uniformly dispersed into a photoresist at least to the nanometer level, a result not achievable by dispersion of metal oxide or metal particles according to known techniques. The same applies to implantation of Sn, discussed above.

Figure 4:
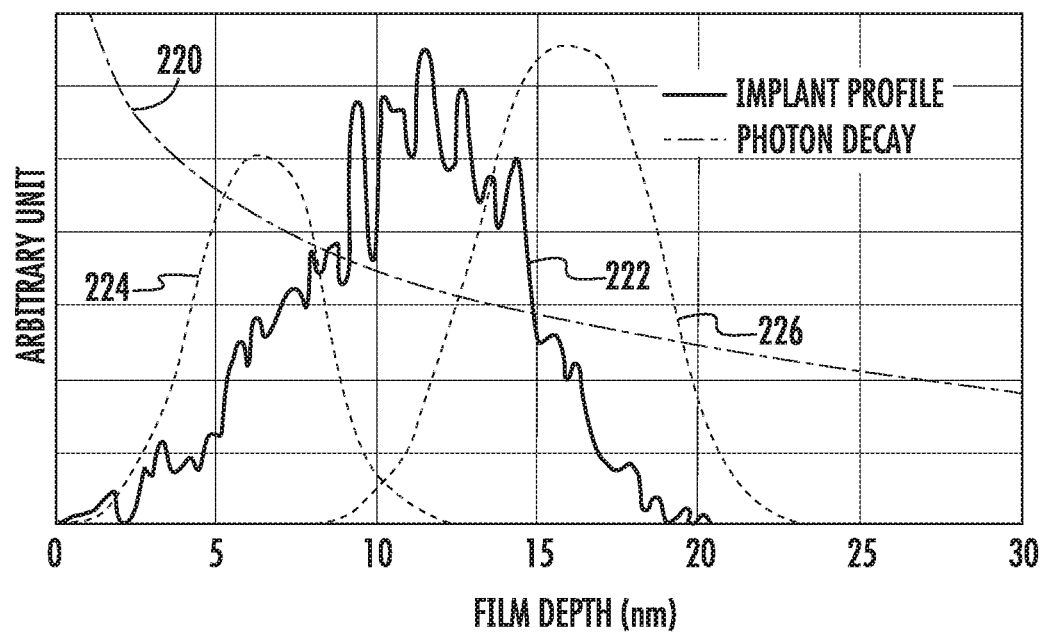
FIG. 4 illustrates photon profile of EUV photons and implant profiles of implant species as a function of depth in a photoresist layer, according to embodiments of the disclosure.
Figure 5:
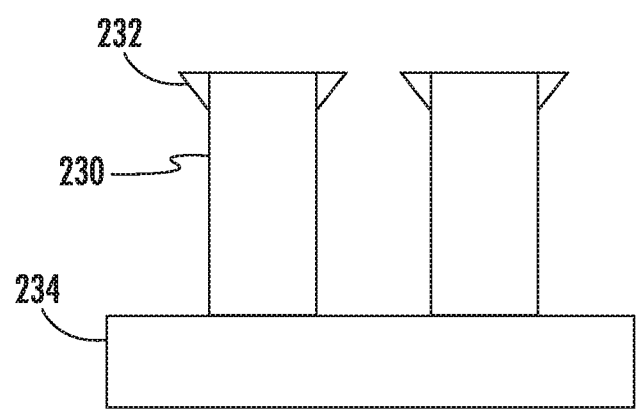
FIG. 5 illustrates a photoresist structure after patterning by EUV exposure.

In various additional embodiments, implantation into blanket EUV photoresist may be performed to tailor the implant profile to account for the nature of EUV exposure. FIG. 4 illustrates a photon profile 220 of EUV photons as a function of depth in a photoresist layer. As evident, the intensity of photons decreases in a generally exponential manner with increasing depth from the outer surface. This decrease in intensity means that portions of a photoresist layer located at greater depths from the surface of a photoresist layer may receive less photon exposure. In the case of a negative tone photoresist, this phenomenon may result in the generation of a patterned resist structure 230 after exposure to an EUV patterning operation, as shown in FIG. 5. The patterned resist structure 230 is shown in profile, where portions of the patterned resist structure 230 closer to the substrate 234 are deeper from the surface of the original blanket photoresist layer. Accordingly, portions of the original photoresist layer closer to the surface receive more photo exposure, resulting in the overhang portions 232, as shown.

In accordance with various embodiments, an ion implantation recipe or process is adjusted to compensate for the photon decay as exhibited in FIG. 4, by placing a higher concentration of implant species at locations removed from the photoresist surface. As an example, implant profile 222 represents an implant profile for Sn species, Xe species, or other species exhibiting an enhanced EUV absorption in comparison the photoresist matrix that hosts the implant species. As shown, the implant profile 222 exhibits a peak at approximately 12 nm below the photoresist surface. In this manner, the relative amount of absorption of EUV photons that reach a depth of 12 nm is enhanced, at least partially compensating for the general reduction in photons as exhibited by the photon profile 220.

In particular embodiments, multiple ion implants of an implant species, such as Sn or Xe may be performed into the blanket photoresist layer. The multiple implants may be used to generate a composite implant profile that is a non-uniform depth profile, functioning to more effectively compensate for the photon decay as a function of depth in a photoresist layer. FIG. 4 exhibits a shallow implant, shown as implant profile 224 and a deep implant, shown as implant profile 226. Together with the implant profile 222, these implant profiles may act to generate a more uniform photon absorption profile as a function of depth in a photoresist layer, such as a 25 nm thick photoresist layer in the example of FIG. 4. As a consequence, a more uniform profile of a patterned resist structure may be formed after exposure to EUV radiation, as exhibited by the rectangular portion of the patterned resist structure 230.

Figure 6A:
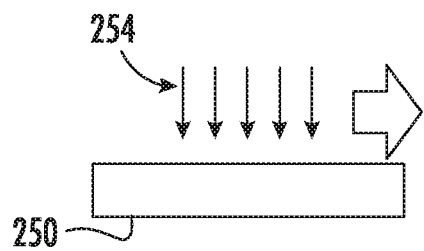
FIGS. 6A-6C illustrate operations involved in a process, according to other embodiments of the disclosure.
Figure 6B:
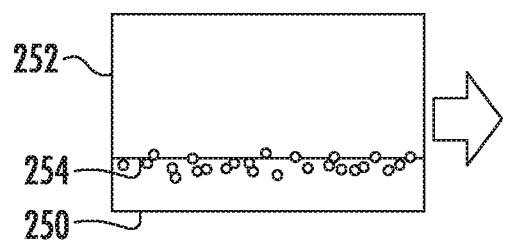
Figure 6C:
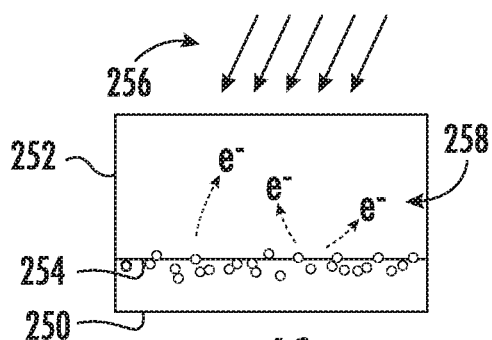

In further embodiments of the disclosure, rather than incorporating a species having enhanced EUV absorption efficiency by directly implanting into a photoresist layer, the species may be implanted into an underlayer, before a photoresist layer is deposited thereon. FIG. 6A, FIG. 6B, and FIG. 6C depict a scenario where implantation of a species for enhanced EUV absorption efficiency, implant species 254, is directed to an underlayer 250, before deposition of a photoresist layer 252. In particular, the ion energy of implant species 254 may be tuned to implant into a top region near a top surface of the underlayer 250, where the underlayer 250 may represent a known underlayer material used in EUV processes. Exemplary ion energies may range from a few hundred eV to 2000 eV. The top region near a top surface of underlayer 250 may accordingly represent a depth of approximately 25 nm or less, or 15 nm or less in some embodiments. Photoresist layer 252 may be applied as in known techniques (FIG. 6B). When subject to EUV radiation, the addition of the implant species 254 along an interface between the underlayer 250 and photoresist layer 252 generates additional photoelectrons 258 (FIG. 6C) to help offset EUV photon decay that occurs as a function of increasing depth from the top surface of the photoresist layer 252, as discussed above. This arrangement also helps minimize T-topping, the appearance of footing on a photoresist feature, and well as minimizing line edge roughness and linewidth roughness.

An advantage afforded by the present embodiments is the ability to generate a photoresist layer with enhanced EUV sensitivity, just at the point of use, in other words, just before a lithography patterning operation is to be performed, such as within 5 hours, within several hours, or even within several minutes. This point-of-use capability avoids problems with non-uniformity, or aging that may occur in known metal oxide resists, where metal oxide particles may settle, agglomerate, redistribute, or otherwise react with resist, when stored in bulk fashion, such as a container. Another advantage is the ability to uniformly disperse an EUV-sensitive species, such as Sn or Xe at the atomic level within a photoresist layer, since the species may be implanted as monatomic ions. This advantage may be especially useful for applications where the total thickness of a photoresist layer is 20 nm or less.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, while the present disclosure has been described herein in the context of a particular implementation in a particular environment for a particular purpose, those of ordinary skill in the art will recognize the usefulness of the present embodiments is not limited thereto and the present embodiments may be beneficially implemented in any number of environments for any number of purposes. Thus, the claims set forth below are to be construed in view of the full breadth of the present disclosure as described herein.

The invention claimed is:

1. A method of improved patterning of a photoresist layer, comprising:
providing an underlayer on a substrate;
performing an ion implantation procedure of an implant species into the underlayer, the implant species comprising an enhanced absorption efficiency at a wavelength in an extreme ultraviolet (EUV) range, the enhanced absorption efficiency being greater than 2×106 cm2/mol, wherein the implant species is implanted into a top region near a top surface of the underlayer;
applying the photoresist layer as a blanket photoresist layer on the underlayer; and
patterning the blanket photoresist layer by exposure to EUV radiation.

2. The method of claim 1, wherein the implant species is Xe.

3. The method of claim 1, wherein the implant species is Sn.

4. The method of claim 1, wherein performing the ion implantation procedure comprises generating a peak in a concentration of the implant species as a function of depth below an outer surface of the underlayer.

5. The method of claim 1, wherein the implant species comprises a gaseous species at room temperature.

6. The method of claim 1, wherein a concentration of the implant species as a function of depth below an outer surface of the underlayer increases to a depth of at least 5 nm.

7. The method of claim 1, wherein the ion implantation procedure comprises a plurality of ion implantation procedures, wherein an implant depth varies between the plurality of implant procedures.

8. The method of claim 7, wherein the plurality of implantation procedures generates a non-uniform depth profile of the implant species as a function of depth in the underlayer, wherein a concentration of the implant species increases as a function of depth within the underlayer.

9. The method of claim 1, wherein an ion energy of the implant species is in a range of 300 hundred eV to 2000 eV.

10. The method of claim 1, wherein the wavelength in the EUV range is 13.5 nm.

11. The method of claim 1, wherein a thickness of the blanket photoresist layer is between 15 nm and 100 nm.

* * * * *